United States Patent
Beer et al.

(10) Patent No.: US 6,691,078 B1
(45) Date of Patent: Feb. 10, 2004

(54) TARGET DESIGN MODEL BEHAVIOR EXPLORER

(75) Inventors: Ilan Beer, Haifa (IL); Eli Dichterman, Haifa (IL); Leonid Gluhovsky, Haifa (IL); Anna Gringauze, Haifa (IL); Yossi Malka, Haifa (IL); Yaron Wolfsthal, Binyamina (IL); Shoham Ben-David, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/362,720

(22) Filed: Jul. 29, 1999

(51) Int. Cl.[7] .............................................. G06F 17/50
(52) U.S. Cl. ................. 703/14; 703/15; 716/5
(58) Field of Search ................ 703/2, 13, 17, 703/14; 706/61; 716/5, 4, 19; 713/201; 717/104, 120; 702/83; 700/86

(56) References Cited

U.S. PATENT DOCUMENTS

| | | | | |
|---|---|---|---|---|
| 5,394,347 A | * | 2/1995 | Kita et al. ...................... | 703/2 |
| 5,615,137 A | * | 3/1997 | Holzmann et al. ............ | 703/17 |
| 5,910,897 A | * | 6/1999 | Dangelo et al. ............... | 716/19 |
| 5,926,622 A | * | 7/1999 | Hardin et al. .................. | 714/33 |
| 5,946,481 A | * | 8/1999 | Kurshan et al. ............... | 703/13 |
| 5,966,516 A | * | 10/1999 | De Palma et al. ............. | 703/1 |
| 6,044,211 A | * | 3/2000 | Jain ............................ | 716/18 |
| 6,131,078 A | * | 10/2000 | Plaisted .......................... | 703/2 |
| 6,163,876 A | * | 12/2000 | Ashar et al. .................... | 716/5 |
| 6,178,394 B1 | * | 1/2001 | Godefroid ...................... | 703/17 |
| 6,185,516 B1 | * | 2/2001 | Hardin et al. .................. | 703/2 |
| 6,275,976 B1 | * | 8/2001 | Scandura ..................... | 717/120 |
| 6,311,293 B1 | * | 10/2001 | Kurshan et al. ............... | 714/37 |
| 6,353,896 B1 | * | 3/2002 | Holzmann et al. ............ | 714/38 |

OTHER PUBLICATIONS

Cerny et al., "Verification of real time controllers against timing diagram specification using constraint logic programming", IEEE 1998.*

Clark, "Formal Methods in System Design– An International Journal", *Kluwer Academic Publishing*, (1985).

Ghosh et al., "Sequential Logic Testing and Verification", *Kluwer Academic Publishing*, (1992).

Beer et al., "Rulebase: an Industry–Oriented Formal Verification Tool", *Design Automation Conference*, pp. 1–7 (1996).

Baumgartner et al., Model Checking the IBM Gigahertz Processor: An Abstraction Algorithm for High–Performance Netlists, *International Conference on Computer–Aided Verification*, pp. 1–10, (1999).

(List continued on next page.)

Primary Examiner—Samuel Broda, Esq.
Assistant Examiner—K Thangavelu
(74) Attorney, Agent, or Firm—Browdy and Neimark, P.L.L.C.

(57) ABSTRACT

A method for exploring the behavior of a design model, the method including the steps of providing a design model represented as a Finite State Machine (FSM). The method further includes the step of providing a path specification of interest. The method further includes the step of exploring the behavior of the design in order to find and present a scenario in the design that meets the path specification.

25 Claims, 3 Drawing Sheets

OTHER PUBLICATIONS

Mittlemeyar, "Alliance Formal Verification Effort", *Presentation in the IBM Internal Verication Conference*(1998).

McMillan, "Symoblic Method Checking", *Kluwer Academic Publishers*, Chapters 1–3, (1993).

Capmbell et al., "The Specification of Process Synchronization by Path Expression", *Lecture Notes Computer Science*, pp. 89–102, (1974).

Schniderman et al, "PAthe Expression for Complex Queries and Automatic Daabase Program Conversion" *IEEE Computer Society*, pp. 1–12, (1980).

Bruegge et al., "Generalized Path Expression: A High Level Debugging Mechanism", *The Journal of Systems and Software*vol. 3, pp. 265–276, (1983).

Kohavi et al., "Introduction to Synchronous Sequential Circuits and Iterative Network", *Switching and Finite Automata Theory*, pp. 275–291.

Beer et al., "On–The–Fly Model Checking of RCTL Formulas", *Presented in the 1998 Conference on Computer–Aided Verification*, (1998).

* cited by examiner

TARGET DESIGN MODEL BEHAVIOR EXPLORER

FIELD OF THE INVENTION

The present invention is in the general field of exploring the behavior of a design and in particular hardware design of a semiconductor chip.

BACKGROUND OF THE INVENTION

REFERENCES

[1] "Formal Methods in System Design—An International Journal" Edmund Clarke (Ed.) Kluwer Academic Publishing 1985-present.
[2] Sequential Logic Testing and Verification", A Ghosh, S. Devadas and R. Newton, Kluwer Academic Publishing, 1992.
[3] "RuleBase: An Industry-Oriented Formal Verification Tool", I. Beer, S. Ben-David, C. Eisner and A. Landver, Design Automation Conference 1996.
[4] "Model Checking the IBM Gigahertz Processor. An Abstraction Algorithm for High-Performance Netlists" by Jason Baymgartner, Tamir Heyman, Adnan Aziz and Vigyan Singhal, Proceedings of the 11$^{th}$ International Conference on Computer-Aided Verification (CAV99), N. Halbwachs and D. Peled (Eds.) Lecture Notes in Computer Science 1633, Springer Verlag, 1999.
[5] "Alliance Formal Verification Effort", S. Mittlemeyar, presentation in the IBM Internal Verification Conference (VAT), September 1998.
[6] "Symbolic Model Checking", K. McMillan, Kluwer Academic Publishing, 1993.
[7] "The Specification of Process Sychronization by Path Expression", R. H. Campbel and A. N. Habermann, in Lecture Notes in Computer Science (G. Goos and J. Heartiness (ed.), Springer, N.Y., 1974, pp. 89–102).
[8] "Path expressions for complex queries and automatic database program conversion". In Proceedings, Very Large Data Bases: 6$^{th}$ international conference, pp. 33–34, IEEE Computer Society, October 1980.
[9] Generalized Path Expression: A High-Level Debugging Mechanism", B. Bruegge and P. Hibbard, J. of Systems and Software 3, 1983, pp. 265–276.
[10] "Switching and Finite Automata Theory" by Zvi Kohavi et al. McGraw Hill College Div.
[11] "On-The-Fly Model Checking of RCTL Formulas" by I. Beer, S. Ben-David and A. Landver, presented in the 1998 Conference on Computer-Aided Verification (CAV98)

The improvements in the silicon, computer and electronic related technologies gave rise to the design of very complicated integrated circuits (IC—referred to also as chips). This trend poses a real challenge to all those automatic and manual verification and inspection procedures which aim at filtering out bugs and faults during the design phase of the specified chips, and thereby to assure with high degree of certainty that faulty chip designs will not be forwarded to manufacture.

Accordingly, the industry is seeking improved technologies, tools and methodologies, to withstand these shortcomings. Thus, it has been suggested to use better techniques for static analysis, e.g. Formal Methods [1]. Such methods have been indeed successfully used in the verification of Finite State Machines (FSMs) in a variety of domains, notably hardware verification [2]. A second, methodological trend, is to ensure that verification starts as early as possible, and is not deferred to later design stages in which detection and correction of flaws is longer and costlier. In fact, an increasing number of design teams are introducing block-level debugging, or exploration, as an integral part of the product development cycle, before integrating the individual units into the target systems [3,4].

The debugging activity is the process in which the implementor explores and experiments with the FSM model by typically testing it against a subset of its feasible inputs. In doing so, the implementor gains insight into the behavior of the FSM model, detects design flaws and corrects them. The related activity of verification (which may or may not be done by the implementor) assures that the implemented FSM meets its functional requirements as thoroughly as possible. In this connection it should be noted that the difference between exploration and verification then, is that inter alia exploration is associated with the implementation process while verification is essentially a post-implementation process. Contemporary exploration methods are limited, as they are generally based on simulation, and require tedious specification of simulation scenarios, which are tested one at a time. That is, all inputs for the model (normally specifying explicitly input vectors) must be specified on a cycle-by-cycle basis to elicit each individual scenario of interest. In practice, given the limitations of contemporary exploration means, and further considering the labor-intensive tedious trial-and-error process, designers tend to carry out exploration of relatively low quality before delivering their FSM models to system verification.[1]

[1] System verification is the activity in which the individual components designed by separate designers are integrated and tested as a system.

Furthermore, the specified cycle-by-cycle process typically requires speculation of what input may drive the design towards the behavior of interest. The inherent parallelism of hardware, together with the inadequacy of the simulation platform for this purpose, render hardware exploration low-productivity activity.

The result is that detection of logic errors in the model are deferred to later verification stages where they are costlier to detect and fix, or even overlooked which is obviously undesired.

There is, accordingly, a need in the art to provide for exploration technique. There is a further need in the art to provide for a technique which obviates the specified cycle-by-cycle tedious trial-and-error procedures.

GLOSSARY OF TERMS

There follows now a glossary of terms, some being conventional and others have been coined herein. The definitions are provided for convenience of explanation only and should by no means be regarded as binding:

| Term | Explanation |
| --- | --- |
| Finite State Machine (FSM); Model | For a definition of this term refer to standard texts, e.g. [10] [2], where, specifically, the concepts of states, transitions and state variables, inputs, signals and executions are defined in detail.<br>Herein, any signals, state variables and/or possibly inputs, are collectively referred to as resources. In this invention, the term FSM is used |

| Term | Explanation |
|---|---|
| | also for referencing infinite-state machines of which a finite-state subset is subjected to examination. Throughout the description of the invention, reference is made to two specific types of FSMs. One is the design - which is the FSM being subjected to analysis. The second type is referred to as an auxiliary FSM, which is an FSM representation of a path specification (defined below). The translation of path specifications to FSMs is known in the literature [11]. |
| Model Checking (MC) | A formal analysis method used for static analysis of FSM. By one application, it accepts as an input two elements - an FSM and a temporal logic formula and returns "true" if the formula is true in the model, or "false" and a counter example otherwise. |
| Path scenario | A sequence of states through which the design passes in one execution. |
| Path specification | A set ot constraints on the resources (see above) of the system, specifying their values and/or interdependencies over time. Path specification is illustrated by the following non-limiting examples:<br>(a) in the first cycle a = 1, and in the second cycle a = 0.<br>(b) In the first cycle a = 1, then in the second cycle a = 0 and then in the third cycle either b = 7 or c = 9.<br>(c) a write command followed by a read command. The read command will receive a retry answer and will consequently be reissued.<br>NOTE:<br>In each of these examples, the path specification in fact represents multiple paths that meet the specification, since no constraints have been posed on the values of the unspecified resources, and/or the timing relationships between the points in time at which specified resources take specified values.<br>It should be noted that in example (c) the terms write command, rd command are shorthand for more elaborate combinations of resource value which represent the behaviors of interest. Thus, for example, the term write command may be a shorthand for "signal wrt is 1". |
| Exploration | The process of examining the behavior of a given FSM by inspecting some executions of interest. With contemporary design technology, exploration is typically done by specifying values for its inputs. |
| Safety property (SP) | A property of an FSM which can be refuted by demonstrating a counter-example of finite length. |

SUMMARY OF THE INVENTION

The growing realization that exploration of hardware models should be a key component of product design cycle (much like the debugging that is done in software), and the increasing power of Formal Verification engines in recent years, have together laid the ground for the concept of Exploration described therein.

In accordance with one embodiment of the invention, the so called Model Checking tool [6] is exploited for hardware design exploration assuming that the design is represented as a Finite State machine (FSM).

Exploration, as a part of the FSM implementation activity, is the process where the implementor explores some legal paths of the FSM model by testing it with respect to a subset of its legal inputs.

The use of formal methods for hardware exploration provides hardware designers with capabilities that far exceed those offered by contemporary simulators, and furnishes insights into the design behavior. Specifically, using the proposed scheme, designers can specify the type of behavior they wish to explore, rather than specify the input vectors to test this behavior as is done in standard simulation. Also, by using this proposed scheme, designers can reason about sets of scenarios using path specifications, rather than carry out the reasoning one scenario at a time. As a result, the tool of the invention brings about increased productivity which, in turn, results in better, faster development cycles for Finite State Machines.

The proposed technique is not limited to hardware modules and may be applicable to other target modules, such as conventional software modules.

Accordingly, the invention provides for a method of exploring the behavior of a design model, the method comprising the steps of:

a. providing a design model represented as a Finite State Machine (FSM);

b. providing a path specification of interest;

c. exploring the behavior of the design in order to find and present a scenario in the design that meets the path specification.

The invention further provides for a system for exploring the behavior of a design model, the system comprising:

(a) input interface for receiving a design model represented as a Finite State Machine (FSM);

(b) input interface for receiving a path specification of interest;

(c) behavior explorer coupled to at least said input interfaces for exploring the behavior of the design in order to find and present a scenario in the design that meets the path specification.

The invention still further provides for a storage medium that stores data representing a computer implemented program, being capable of a. receiving a design model represented as a Finite State Machine (FSM);

b. receiving a path specification of interest;

c. exploring the behavior of the design in order to find and present a scenario in the design that meets the path specification.

BRIEF DESCRIPTION OF THE DRAWINGS

For a better understanding, the invention will now be described by way of example only, with reference to the accompanying drawings, in which.

DETAILED DESCRIPTION OF SPECIFIC EMBODIMENTS

Figure 1:
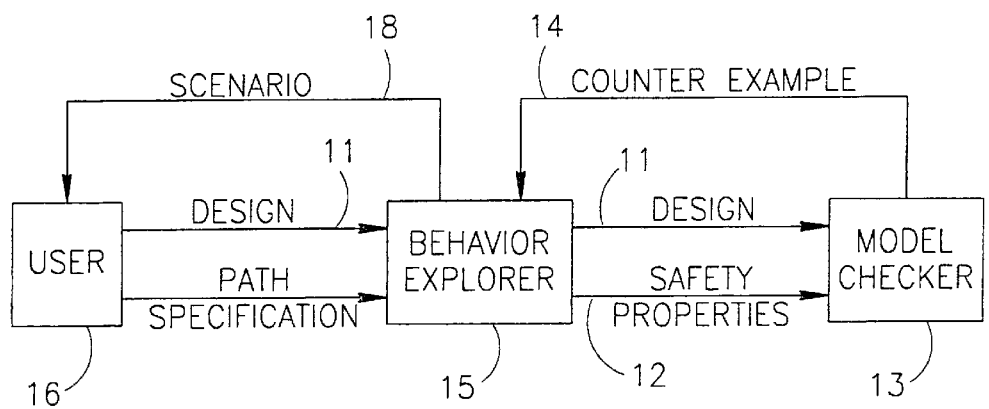
FIG. 1 is a block diagram of a generalized target design model behavior exploring tool in accordance with one embodiment of the invention.

Attention is first directed to FIG. 1 showing a generalized structure of a design behavior exploring tool according to one embodiment of the invention, using Model Checking.

Model Checking involves an algorithm that, given a design in the form of FSM (11) and properties (12) tests if the properties hold true for all the execution paths of the model. In the context of the invention, a subset of properties (referred to hereinafter as safety properties), are used in a manner, which will be explained in greater detail below. The safety properties correspond to path specifications.

Typical properties refer to boolean conditions that should hold for all states, for a part of them, or for specific sequences of states. When the model checker (13) finds that a property is not satisfied, it produces a path (or scenario) standing for counter-example (14) which demonstrates the scenario where the property fails. As an example, if the property states that "Signal A and signal B always have identical values", the Model Checking algorithm will generate a sequence of states in which some state will have different values for A and B.

As shown in FIG. 1, Model Checking module (13) is coupled to behavior explorer module (15) which in turn is coupled to user interface. The user feeds, through user interface (16), (e.g. Graphic User Interface—GUI) path specification (17) and design (18) to the behavior explorer (15). The behavior explorer, in its turn, transforms (in a manner which will be exemplified below) the path specification into safety property representation (12) which is fed together with the design (11) to the MC module for processing in the manner specified. The counter example (14) is returned to behavior explorer module (15) which delivers as an output through the user interface a scenario 18 (that corresponds to the counter example (14)), or, otherwise, an indication that no such scenario exists (in the case that no counter-example is found).

Figure 2:
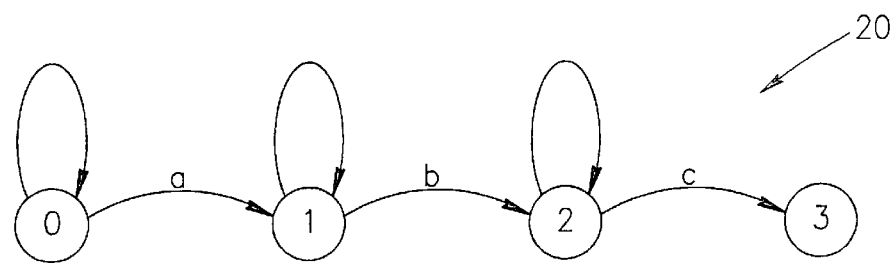
FIG. 2 is an exemplary auxiliary FSM, which together with a temporal formula represents a safety property, for use with the model checking module of FIG. 1.

Consider, for example, a hardware exploration process where the designer/user wished to examine a given behavior. To this end, the designer provides a path specification, which is transformed to SP, preferably in an automatic fashion. For example, consider a non-limiting example of the safety property representation in the form of an auxiliary FSM (20 in FIG. 2), and a temporal formula (not shown). The auxiliary FSM of FIG. 2 corresponds to the following path specification: find a path in which A occurs followed by the occurrence of B, followed by the occurrence of C. There are no time constraints as to when A, B or C occurs. The path specification is transformed to auxiliary FSM (20) and the following Simple Temporal Formula statement "the auxiliary FSM never reaches state 3". The auxiliary FSM and the temporal formula are fed to the model checker through input (12) together with the design under inspection (not shown) through input (11). If the model checker detects a counter-example ((14) in FIG. 1, i.e. by this embodiment a path that leads to state 3), this counter example is presented to the user as a scenario (18) which meets the path specification.

The designer then has the desired behavior, and a scenario in which it occurs, to inspect or refine. The reliance of the solution in accordance with the invention on path specifications, which can represent multiple paths, provides the advantages of: (1) the ability to explore multiple executions, and (2), the ability to specify and elicit scenarios of interest without specifying the driving inputs to reach them.

It is recalled in this connection, that according to hitherto known techniques the designer must specify explicitly the input vector(s) for which a desired behavior is checked in the inspected design. In contrast, in accordance with the latter example of the invention the designer (referred to also occasionally as user) is not compelled to specify the input (albeit he/she may optionally opt to do so).

These advantages, in turn, enable higher productivity and earlier, cheaper detection and correction.

Figure 3:
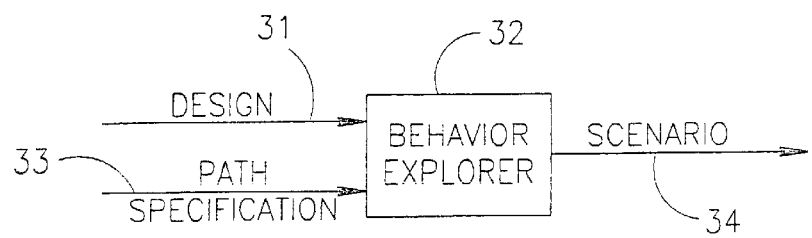
FIG. 3 is a block diagram of a generalized target design model behavior exploring tool in accordance with the invention.

Those versed in the art will readily appreciate that utilizing a model checker is only one out of many possible means of exploring models. Thus, FIG. 3 illustrates a generalized block diagram of a target design model behavior-exploring tool in accordance with the invention. As shown a design model (31) represented as FSM is fed to design behavior explorer module (32), which receives also as an input path specification description (33). The explorer then explores whether the design may behave according to the path specification and delivers as an output the results of the test.

Applying the proposed technique of the invention would enable to effectively explore the behavior of the design at block level whilst obviating the tedious task of applying specific input vectors to "cover" the repertoire of behaviors of each sub-block.

Figure 4:
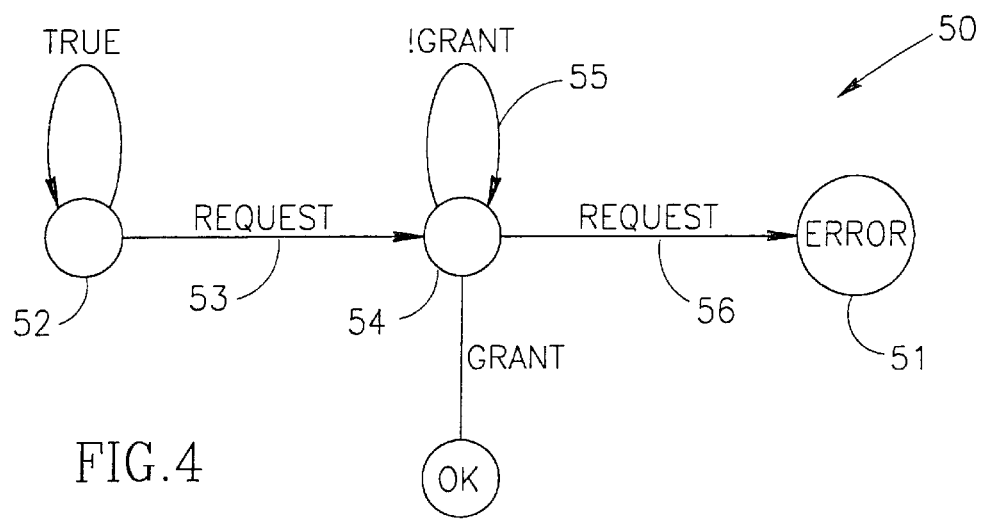
FIG. 4 is an exemplary auxiliary FSM, which together with a temporal formula represents a safety property, for use with a model checking module for a specific hardware design application.

Turning now to FIG. 4, there is shown an exemplary auxiliary FSM (50), which together with a temporal formula represents a safety property for use with CTL model checking [6] in connection with a specific hardware design application. In this design example, it is required to test whether there exists in the design a path which corresponds to two subsequent 'bus request' without 'grant' in between. The path specification that corresponds to this requirement is: [*], request, !grant[*], request (i.e. any prefix followed by request, then any number of not grants and then another request).

The safety property that corresponds to this path specification (expressed in CTL—temporal logic, see [6]) is: AG(request->AX(!request WeakUntil grant)).

A specific implementation of the specified SP is the auxiliary FSM of FIG. 4 and the formula AG(state !=error).

The formula states that there will never be a path (in the auxiliary FSM of FIG. 4) which will reach the state error (51). A counter example would then be that there exists a path that reaches the state error. As readily arises from the auxiliary FSM of FIG. 4, reaching the state error necessarily implies passing through state (52), transition (53) (standing for request), state (54) (as many not grants as desired—transition (55), transition (56) (standing for the second request). The specified path (being the counter example) is the exact scenario that meets the path specification, i.e. two requests without grant in between.

Figure 5:
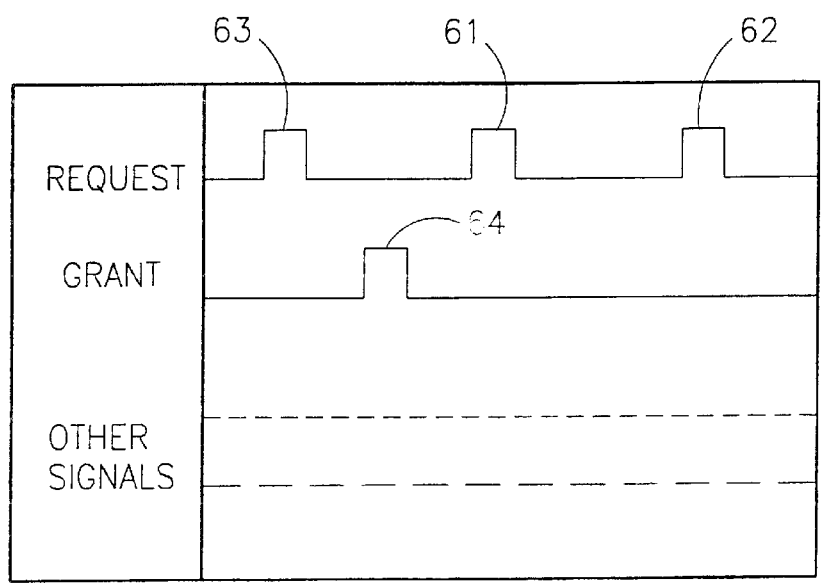
FIG. 5 is a graphic chart illustrating a counter-example for the embodiment of FIG. 4.

The counter-example is depicted graphically in FIG. 5 where as is shown two requests (61) and (62) are not separated by grant. The request (63) and grant (64) fall into the prefix (*) of the path specification and therefore the "seemingly wrong" behavior request (63) grant (64) and request (61) are ignored.

The utilization of the invention is by no means bound to exploring hardware designs and may apply to other designs, e.g. software design or pneumatic design.

Consider, for example, a software code in which the following behavior is explored: show a path in the design (that corresponds to a source code of a computer program), where the execution passes through line 100 (in the code) to line 130 (in the code) without passing through line 70 (in the code).

The implementation is similar to that described with reference to FIG. 4, to wit: Path Specification is [*], line= 100, line !=70 [*], line =130.

Turnings now to an example in the field of pneumatics, consider the following specification: show a path where tap#5 opens and later valve#7 opens. A partial path specification that corresponds to this requirement is: [*], tap__5_close, tap__5_open, [*], valve__7_close, valve__7_open.

Those versed in the art will readily appreciate that the realization of path specification is by no means bound to the specific model checking implementation.

There follows a non-limiting list of path specification implementations:

CTL model checkers

LTL model checkers

BDD-Based Model Checkers

Explicit-Representation Model Checkers

In the specified list of model checkers, each is adapted to receive as an input a safety property representation.

Language-Containment Model Checkers, where the path specification is translated to an automaton;

Model Checkers based on Satisfiability Procedures, where the path specification is translated to an instance of the satisfiability problem;

Theorem Provers, where the path specification is translated to a formula in a first-order logic or higher-order logic.

Figure 6:
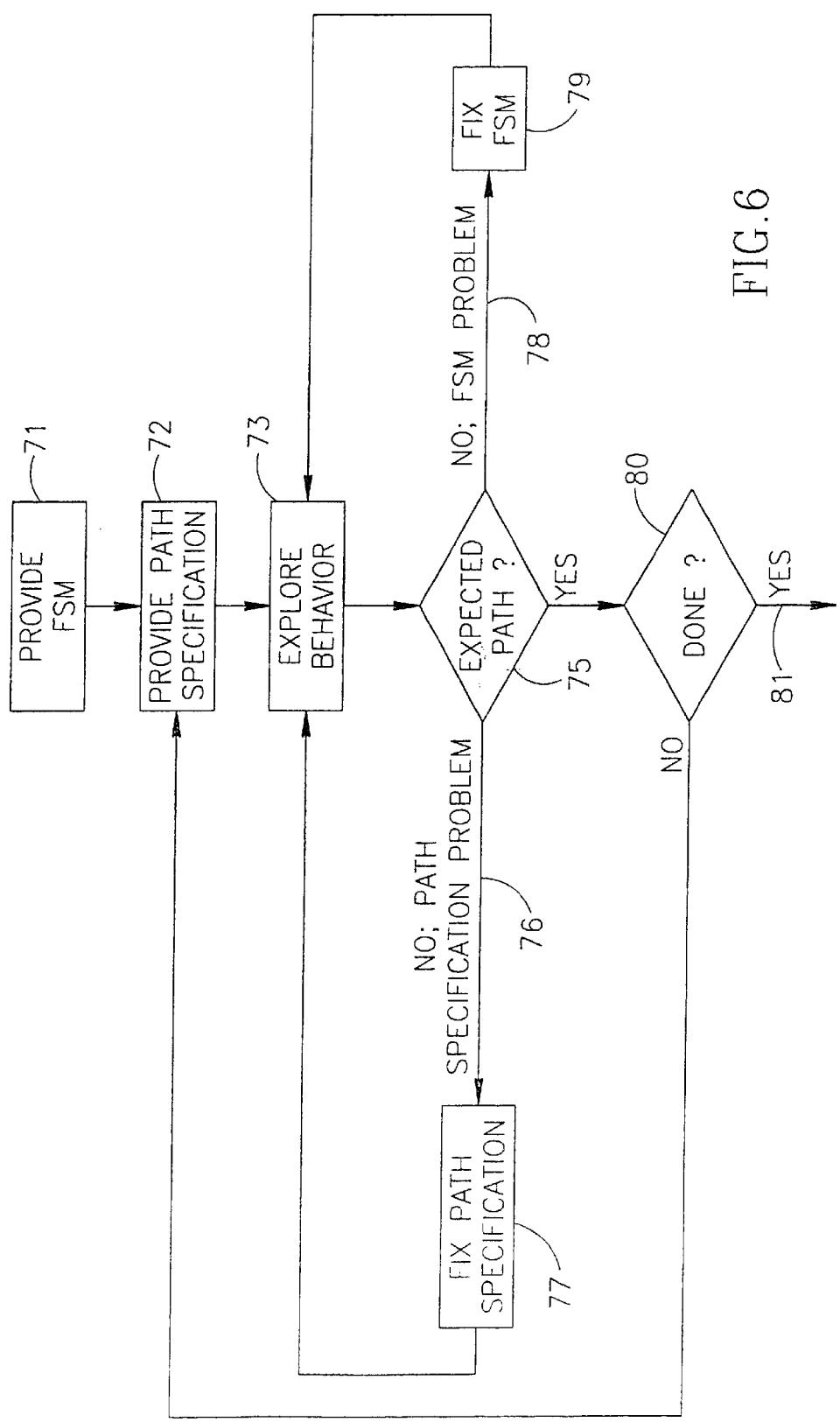
FIG. 6 illustrates schematically a process which utilizes a behavior exploring tool in accordance with one embodiment of the invention.

There follows now, with reference to FIG. 6 a flow diagram of a typical, yet not exclusive example of exploring the behavior of a hardware design.

1. At the onset, (step 71), the designer provides a design, e.g. in a form of FSM;
2. The designer further provides path specification (72). In the specific case of MC, the path specification is automatically or otherwise translated into specific representation, say safety properties;
3. The design and the path specification are fed to the behavior explorer (73);
4. If a set of paths which meets the specified requirements exists, one or more representative paths (constituting one or more scenarios) are presented to the designer (step 75).
5. If the designer is not satisfied with the path or wishes to explore other paths, the specifications can be modified or refined (76–77).
6. Executions that match a specified pattern of interest can be recorded for inspection and/or further refinement (not shown).
7. Designers can incrementally mutate existing scenarios and investigate variations of scenarios of interest, e.g. scenarios in which logic flaws have been previously detected (not shown).
8. As a result of exploration, the designer may wish to fix or alter the design itself (steps 78 and 79).

After the design is modified, the process can be repeated to verify that the desired execution paths are still valid.

9. In the case that the designer is satisfied, the procedure terminates (80, 81)

The key benefits of the behavior exploration scheme, and the source for the derived productivity advantages are, amongst others, the following:

Hardware designers are provided with exploration capabilities applicable for hardware, software and possibly other applications. These capabilities, not present in their current tool set, are based e.g. on Model Checking but do not require the designer to master sophisticated Formal Verification techniques.

The reasoning capability provided by the tool of the invention applies to a plurality of all viable executions. That is, unlike simulation-based hardware verification and software debugging, where execution sequences are tested one at a time, the tool of the invention enables the analysis of multiple executions.

Relying on the underlying behavior exploring engine, designers can investigate execution patterns without the need to fully specify them. That is, rather than providing values for every input at every cycle, designers can simply specify the type of behavior they wish to explore (e.g. path specification they wish to elicit).

The present invention has been described with a certain degree of particularity but various alterations and modifications may be carried out without departing from the spirit and scope of the following claims:

What is claimed is:

1. A method for exploring the behavior of a design model, the method comprising the steps of:
 a. providing a design model represented as a Finite State Machine (FSM);
 b. providing a path specification of interest;
 c. exploring the behavior of the design in order to find and present a scenario in the design that meets the path specification.

2. The method of claim 1, in which said step (b) further includes:
 transforming said path specification into safety properties; and
 said step (c) includes exploring the behavior of said design by applying model checking technique for determining whether said safety properties are met in said design, and if not finding and presenting a counter example.

3. The method according to claim 1, further comprising the steps of:
 (d) repeating at least one of said steps (a) to (c) as many times as required.

4. The method according to claim 2, further comprising the steps of:
 (d) repeating at least one of said steps (a) to (c) as many times as required.

5. The method according to claim 2, wherein said properties are expressed each as Boolean conditions.

6. The method according to claim 1, wherein said design model corresponds to a hardware design model.

7. The method according to claim 2, wherein said design model corresponds to a hardware design model.

8. The method according to claim 1, wherein said design model corresponds to a software design model.

9. The method according to claim 2, wherein said design model corresponds to a software design model.

10. The method according to claim 1, wherein said path specification is representative of the following state: the design is devoid of a given bug and in the case that the exploring step determines that the design behaves according to the path specification this indicates that the design is verified to be bug-free in respect of said bug, otherwise the design has said bug.

11. The method according to claim 2, wherein said safety properties are representative of the following state: the design is devoid of a given bug and in the case that the model checking step determines that the paths in said FSM meet said specified safety properties, this indicates that the design is verified to be bug-free in respect of said bug, otherwise if the model checking step reports on at least one path that does not meet said path specification, this indicates that the design has said bug.

12. The method according to claim 2, wherein said model checking technique being of the CTL model checker type.

13. The method according to claim 2, wherein said model checking technique being of the BDD-Based Model Checker type.

14. The method according to claim 2, wherein said model checking technique being of the Explicit-Representation Model Checker type.

15. The method according to claim 2, wherein said model checking technique being of the Language-Containment Model Checkers, where the path specification is translated to an automaton.

16. The method according to claim 2, wherein said model checking technique being of the Satisfiability Procedures, where the path specification is translated to an instance of the satisfiability problem.

17. The method according to claim 2, wherein said model checking technique being of the LTL model checker type.

18. The method according to claim 1, wherein said behavior explorer being of the Theorem Prover type, and wherein the path specification is translated to a formula in a first-order logic or higher-order logic.

19. The method according to claim 1, further including the step of providing input vectors of interest and wherein said step (c) includes: exploring the behavior of the design in order to find and present a scenario in the design that meets the path specification for the specified input vectors.

20. A system for exploring the behavior of a design model, the system comprising:
 (a) input interface for receiving a design model represented as a Finite State Machine (FSM) and a path specification of interest; and
 (b) behavior explorer coupled to at least said input interface for exploring the behavior of the design in order to find and present a scenario in the design that meets the path specification of interest.

21. The system according to claim 20, wherein said path specification is fed to said behavior explorer using a Graphical user interface (GUI).

22. The system according to claim 20, wherein said behavior explorer includes a model checker being fed with safety properties that are transferred from said path specification, for determining whether said safety properties are met in said design, and if not, finding and presenting a counter example.

23. The system according to claim 22, wherein said safety properties are fed to said model checker using a Graphical user interface (GUI).

24. A storage medium that stores data representing a computer implemented program, being capable of
 a. recieving a design model represented as a Finite State Machine (FSM);
 b. recieving a path specification of interest;
 c. exploring the behavior of the design in order to find and present a scenario in the design that meets the path specification.

25. A method for exploring the behavior of a design model, the method comprising the steps of:
 (a) providing a design model represented as a Finite State Machine (FSM);
 (b) providing a path specification of interest;
 (c) exploring the behavior of the design in order to find and present a scenario in the design that meets the path specification; and
 (d) halting the exploring step when a scenario that meets the path specification is found.

* * * * *